(12) United States Patent
Kim et al.

(10) Patent No.: US 9,465,246 B2
(45) Date of Patent: Oct. 11, 2016

(54) SUBSTRATE FOR IN-CELL TYPE TOUCH SENSOR LIQUID CRYSTAL DISPLAY DEVICE AND METHOD OF FABRICATING THE SAME

(71) Applicant: LG DISPLAY CO., LTD., Seoul (KR)

(72) Inventors: Min-Su Kim, Seoul (KR); Myeong-Sik Lee, Gyeonggi-do (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 14/930,902

(22) Filed: Nov. 3, 2015

(65) Prior Publication Data

US 2016/0054609 A1    Feb. 25, 2016

Related U.S. Application Data

(62) Division of application No. 13/333,053, filed on Dec. 21, 2011, now Pat. No. 9,201,533.

(30) Foreign Application Priority Data

Apr. 21, 2011   (KR) .................. 10-2011-0037243

(51) Int. Cl.
*G06F 3/041*    (2006.01)
*G06F 3/044*    (2006.01)
*G02F 1/1333*   (2006.01)
(Continued)

(52) U.S. Cl.
CPC ......... *G02F 1/13338* (2013.01); *G02F 1/1368* (2013.01); *G02F 1/136227* (2013.01); *G02F 1/136286* (2013.01); *G06F 3/044* (2013.01); *G06F 3/0412* (2013.01); *H01L 27/1274* (2013.01); *G02F 2001/134372* (2013.01); *G02F 2001/136295* (2013.01); *G06F 3/047* (2013.01); *G06F 2203/04103* (2013.01)

(58) Field of Classification Search
CPC ...... G06F 3/0412; G06F 3/044; G06F 3/047; G06F 2203/04103; G02F 1/13338
See application file for complete search history.

(56) References Cited

U.S. PATENT DOCUMENTS 5,990,999 A    11/1999  Yeo
2007/0273560 A1    11/2007  Hua et al.
(Continued)

FOREIGN PATENT DOCUMENTS

KR    10-2011-0020049 A    3/2011
WO    2010/088659 A1    8/2010

OTHER PUBLICATIONS

German Office Action dated Feb. 25, 2013, for corresponding German application No. 10 2011 088 319.3.
(Continued)

*Primary Examiner* — Nathanael R Briggs
*Assistant Examiner* — Alexander Gross
(74) *Attorney, Agent, or Firm* — Morgan, Lewis & Bockius LLP

(57) ABSTRACT

An array substrate for an in-cell type touch sensor liquid crystal display device includes: a substrate; a gate line and a data line on the substrate; a thin film transistor connected to the gate line and the data line; a first passivation layer on the thin film transistor; a common electrode on the first passivation layer; an etching preventing pattern covering the drain contact hole; an x sensing line and a y sensing line on the common electrode; a second passivation layer on the x sensing line and the y sensing line; and a pixel electrode on the second passivation layer.

9 Claims, 19 Drawing Sheets

(51) Int. Cl.
*G02F 1/1362* (2006.01)
*G02F 1/1343* (2006.01)
*G02F 1/1368* (2006.01)
*H01L 27/12* (2006.01)
*G06F 3/047* (2006.01)

(56) References Cited

U.S. PATENT DOCUMENTS

| | | |
|---|---|---|
| 2008/0062140 A1 | 3/2008 | Hotelling et al. |
| 2008/0180407 A1 | 7/2008 | Utsunomiya et al. |
| 2009/0027579 A1 | 1/2009 | Aota et al. |
| 2009/0179868 A1 | 7/2009 | Ayres et al. |
| 2010/0144391 A1 | 6/2010 | Chang et al. |
| 2010/0151606 A1 | 6/2010 | Kim et al. |
| 2010/0194695 A1 | 8/2010 | Hotelling et al. |
| 2010/0194707 A1 | 8/2010 | Hotelling et al. |
| 2010/0244037 A1 | 9/2010 | Shiota |

OTHER PUBLICATIONS

Office Action dated Oct. 17, 2014, issued by the Korean Intellectual Property Office in Korean Patent Application No. 10-2011-0037243.

SUBSTRATE FOR IN-CELL TYPE TOUCH SENSOR LIQUID CRYSTAL DISPLAY DEVICE AND METHOD OF FABRICATING THE SAME

This application is a divisional of U.S. patent application Ser. No. 13/333,053, filed on Dec. 21, 2011, which claims the benefit of Korean Patent Application No. 10-2011-0037243 filed in Korea on Apr. 21, 2011, the entire disclosure of each of which is hereby incorporated by reference in its entirety for all purposes.

BACKGROUND

1. Field of the Disclosure

The present disclosure relates to a liquid crystal display device, and more particularly, to a substrate for an in-cell type touch sensor liquid crystal display device including where an electrical shortage between metal patterns in a contact hole is prevented and a method of fabricating the substrate.

2. Discussion of the Related Art

Recently, a liquid crystal display (LCD) device has been in the spotlight as a next generation display device having high value added because of its low power consumption and good portability. An active matrix liquid crystal display (AM-LCD) device, which includes thin film transistors as a switching device for a plurality of pixels, has been widely used due to its high resolution and superiority in displaying moving images.

In general, the LCD device is fabricated through an array substrate process for forming a thin film transistor and a pixel electrode on an array substrate, a color filter substrate process for forming a color filter layer and a common electrode on a color filter substrate and a cell process for forming a liquid crystal layer between the array substrate and a color filter substrate.

FIG. 1 is an exploded perspective view showing a liquid crystal display device according to the related art. In FIG. 1, the liquid crystal display (LCD) device includes an array substrate 10, a color filter substrate 20 and a liquid crystal layer 30 between the array substrate 10 and the color filter substrate 20. The array substrate 10 includes a first substrate 12, a gate line 14 on the first substrate 12, a data line 16 crossing the gate line 14 to define a pixel region P, a thin film transistor (TFT) T connected to the gate line 14 and the data line 16 and a pixel electrode 18 connected to the TFT T.

In addition, the color filter substrate 20 facing the array substrate 10 includes a second substrate 22, a black matrix 25 blocking a non-display area corresponding to the gate line 14, the data line 16 and the TFT T, a color filter layer 26 including red, green and blue color filters 26a, 26b and 26c each corresponding to the pixel region P and a common electrode 28 on an entire surface of the second substrate 22.

Although not shown in FIG. 1, a seal pattern may be formed in a boundary portion between the array substrate 10 and the color filter substrate 20 for preventing leakage of the liquid crystal layer 30. A lower orientation film may be formed between the array substrate 10 and the liquid crystal layer 30 and an upper orientation film may be formed between the color filter substrate 20 and the liquid crystal layer 30 for aligning the liquid crystal layer initially. Further, a polarizing plate may be formed on an outer surface of at least one of the first and second substrates 12 and 22.

A backlight unit may be disposed under the array substrate 10 to supply light. When a gate signal turning on the TFT T is sequentially supplied to the gate line 14, the TFT T is turned on and a data signal supplied to the data line 16 is applied to the pixel electrode 18 through the TFT T. As a result, a vertical electric field is generated between the pixel electrode 18 and the common electrode 28 and liquid crystal molecules in the liquid crystal layer 30 are re-aligned by the vertical electric field, thereby the LCD device displaying images due to transmittance change of the liquid crystal layer 30.

However, the LCD device driven using the vertical electric field has a disadvantage in viewing angle. Accordingly, an in-plane switching (IPS) mode LCD device or a fringe field switching (FFS) mode LCD device where a pixel electrode and a common electrode are formed on an array substrate and liquid crystal molecules are driven by a horizontal electric field generated between the pixel electrode and the common electrode has been suggested. The IPS mode LCD device or the FFS mode LCD device is used for various application products such as a television, a projector, a mobile phone and a personal digital assistant (PDA). In addition, the various application products have a function sensing a touch. An LCD device including a touch sensor integrated therein may be referred to as an in-cell type touch sensor LCD device.

An array substrate for an in-cell type touch sensor LCD device has a plurality of touch blocks for sensing a touch and a plurality of sensing lines connected to the plurality of touch blocks as well as the gate line and the data line. For example, when a polycrystalline silicon thin film transistor (TFT) having an excellent mobility is used as a switching element, an array substrate for an in-cell type touch sensor LCD device may be formed through an eleven-mask process. Further, the array substrate may include a gate insulating layer, an interlayer insulating layer, an auxiliary insulating layer, a first passivation layer and a second passivation layer. The auxiliary insulating layer includes an inorganic insulating material to improve adhesion between a conductive line of a metallic material such as a data line, a source electrode and a drain electrode and the first passivation layer of an organic insulating material.

For the purpose of simplifying fabrication process, the step of forming the auxiliary insulating layer. However, when the auxiliary insulating layer is omitted, the drain electrode and a data pad connected to the data line are exposed through a contact hole in the first passivation layer. The exposed drain electrode and the data pad may be deteriorated due to an etching solution for a common electrode of a transparent material or a solution for a sensing line of a metallic material on the first passivation layer. As a result, a contact property of the drain electrode and the data pad is deteriorated.

SUMMARY

An array substrate for an in-cell type touch sensor liquid crystal display device includes: a substrate including a plurality of touch blocks each including a plurality of pixel regions; a gate line and a data line on the substrate, the gate line and the data line crossing each other with an interlayer insulating layer interposed therebetween to define each of the plurality of pixel regions; a thin film transistor connected to the gate line and the data line; a first passivation layer on the thin film transistor, the first passivation layer having a first drain contact hole exposing a drain electrode of the thin film transistor; a common electrode on the first passivation layer in each of the plurality of touch blocks; an etching preventing pattern covering the drain contact hole, the etching preventing pattern having a same material and a same layer as the common electrode, and the etching preventing pattern spaced apart from the common electrode; an x sensing line and a y sensing line on the common electrode, the x sensing line overlapping the gate line and the y sensing line overlapping the data line; a second passivation layer on the x sensing line and the y sensing line, the second passivation layer having a second drain contact hole exposing the etching preventing pattern; and a pixel electrode on the second passivation layer in each of the plurality of pixel regions, the pixel electrode contacting the etching preventing pattern through the second drain contact hole and having a plurality of open areas each having a bar shape.

In another aspect, a method of fabricating an array substrate for an in-cell type touch sensor liquid crystal display device includes: forming a gate line, a data line and a thin film transistor on a substrate including a plurality of touch blocks each including a plurality of pixel regions, the gate line and the data line crossing each other with an interlayer insulating layer interposed therebetween to define each of the plurality of pixel regions, and the thin film transistor connected to the gate line and the data line; forming a first passivation layer on the thin film transistor, the first passivation layer having a first drain contact hole exposing a drain electrode of the thin film transistor; forming a common electrode and an etching preventing pattern on the first passivation layer, the common electrode disposed in each of the plurality of touch blocks, the etching preventing pattern spaced apart from the common electrode, and the etching preventing pattern having an area greater than the drain contact hole to completely cover the drain electrode; forming an x sensing line and a y sensing line on the common electrode, the x sensing line overlapping the gate line and the y sensing line overlapping the data line; forming a second passivation layer on the x sensing line and the y sensing line, the second passivation layer having a second drain contact hole exposing the etching preventing pattern; and forming a pixel electrode on the second passivation layer in each of the plurality of pixel regions, the pixel electrode contacting the etching preventing pattern through the second drain contact hole and having a plurality of open areas each having a bar shape.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings.

DETAILED DESCRIPTION OF THE EXEMPLARY EMBODIMENTS

Reference will now be made in detail to the preferred embodiments, examples of which are illustrated in the accompanying drawings.

Figure 1:
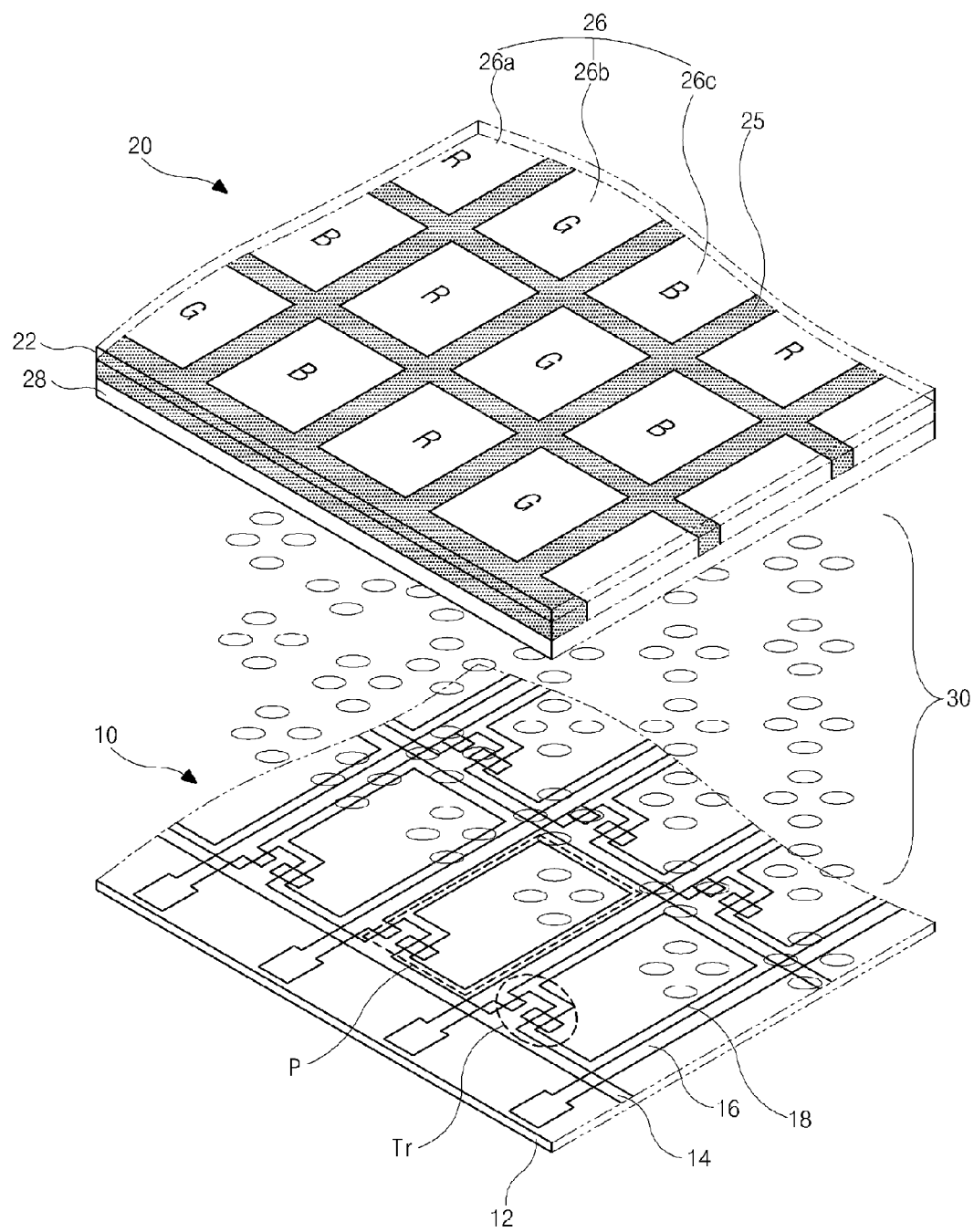
FIG. 1 is an exploded perspective view showing a liquid crystal display device according to the related art.
Figure 2:
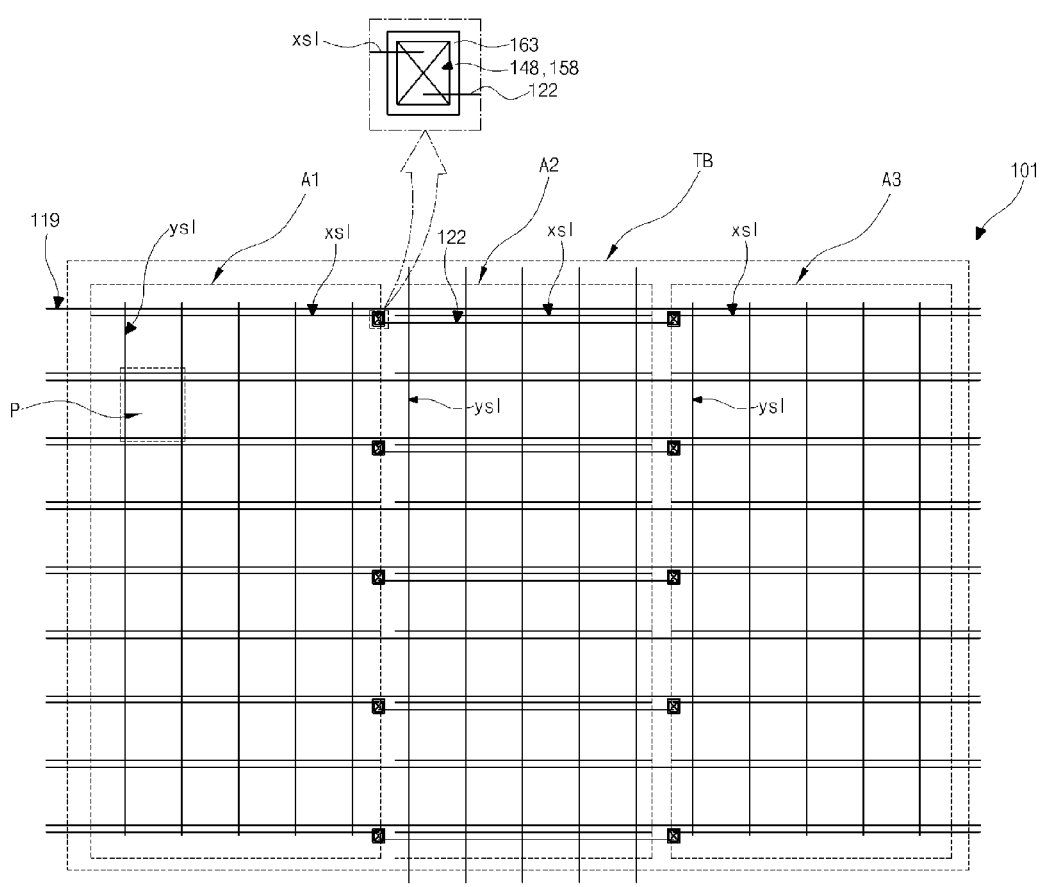
FIG. 2 is a plan view showing a touch block of an array substrate for an in-cell type touch sensor liquid crystal display device according to an embodiment of the present invention.
Figure 3:
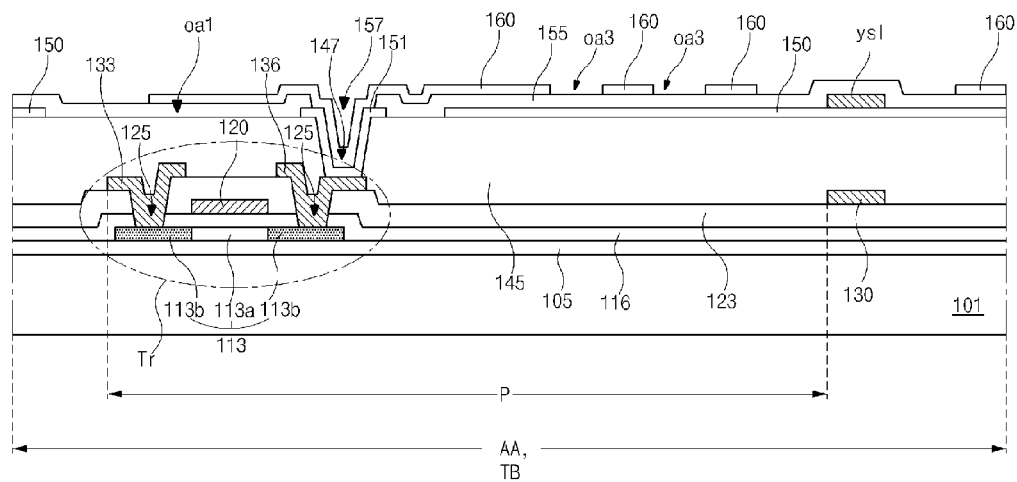
FIG. 3 is a cross-sectional view showing a pixel region of an array substrate for an in-cell type touch sensor liquid crystal display device according to an embodiment of the present invention.
Figure 4:
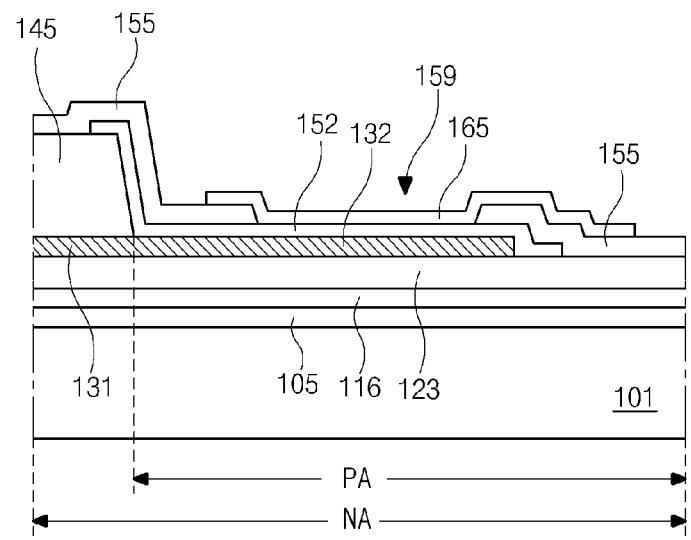
FIG. 4 is a cross-sectional view showing a pad area of an array substrate for an in-cell type touch sensor liquid crystal display device according to an embodiment of the present invention.
Figure 5:
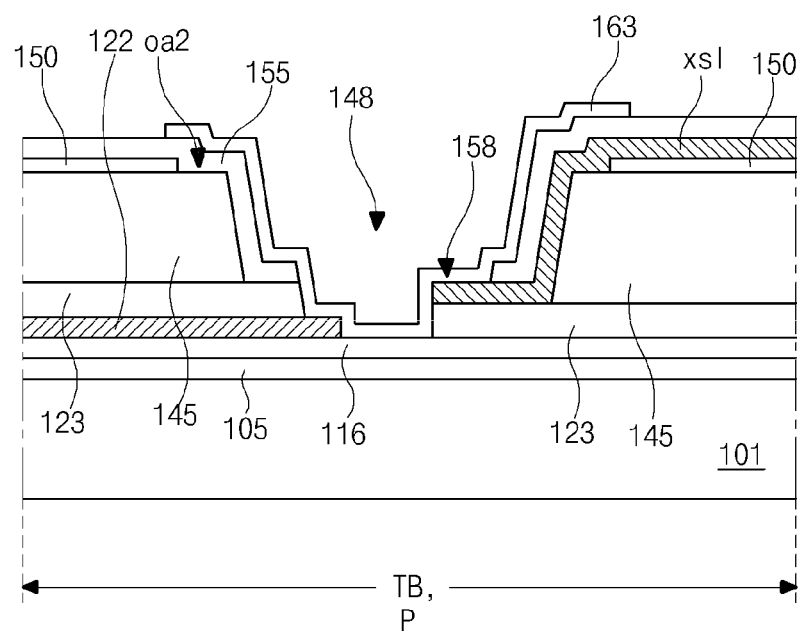
FIG. 5 is a cross-sectional view showing an end portion of a touch block of an array substrate for an in-cell type touch sensor liquid crystal display device according to an embodiment of the present invention.

FIG. 2 is a plan view showing a touch block of an array substrate for an in-cell type touch sensor liquid crystal display device according to an embodiment of the present invention, and FIG. 3 is a cross-sectional view showing a pixel region of an array substrate for an in-cell type touch sensor liquid crystal display device according to an embodiment of the present invention. In addition, FIG. 4 is a cross-sectional view showing a pad area of an array substrate for an in-cell type touch sensor liquid crystal display device according to an embodiment of the present invention, and FIG. 5 is a cross-sectional view showing an end portion of a touch block of an array substrate for an in-cell type touch sensor liquid crystal display device according to an embodiment of the present invention.

In FIGS. 2 to 5, an array substrate 101 for an in-cell type touch sensor liquid crystal display (LCD) device includes an active area AA displaying an image and a non-active area NA surrounding the active area NA. The active area AA may include a plurality of touch blocks TB, and each touch block TB may include a plurality of pixel regions P. In addition, the non-active area NA includes a pad area PA. Since a touch sensor detects a touch of a finger, the array substrate for an in-cell type touch sensor LCD device includes the plurality of touch blocks TB each including the plurality of pixel regions P.

In FIG. 2, a touch block TB includes first, second and third areas A1, A2 and A3. A gate line 119, an x sensing line xsl and a y sensing line ysl are formed in the first, second and third areas A1, A2 and A3 on the substrate 101. The x sensing line xsl is parallel to and spaced apart from the gate line 119, and the y sensing line ysl crosses the gate line 119. The x sensing line xsl may cross the y sensing line ysl through a jumping line (not shown) of a conductive material in another layer. As a result, the second area A2 is connected to upper and lower touch blocks (not shown) of the second area A2 through the y sensing line ysl. In addition, the first and third areas A1 and A3 are connected to left and right touch blocks (not shown), respectively, through the x sensing line xsl. For example, the first area A1 may be connected to a third area A3 of the left touch block through the x sensing line xsl, and the third area A3 may be connected to a first area A1 of the right block through the x sensing line xsl.

The x sensing line xsl of the second area A2 has a bar shape such that the x sensing line xsl of the second area A2 is electrically separated from the x sensing lines xsl of the first and third areas A1 and A3. Accordingly, the x sensing lines xsl of the first to third areas A1 to A3 are electrically separated at a border between the first and second areas A1 and A2 and between the second and third areas A2 and A3.

The x sensing lines xsl of the first and third areas A1 and A3 are electrically connected to each other through an auxiliary sensing line 122 of the second area A2. For example, an end portion of the x sensing lines xsl of the first area A1 is connected to an end portion of the auxiliary sensing line 122 of the second area A2 in a first sensing contact hole 148 of a first passivation layer 145 (of FIG. 3) and a second sensing contact hole 155 (of FIG. 3) at the boundary of the first area A1 through a connecting pattern 163 (of FIG. 3). Similarly, an end portion of the x sensing lines xsl of the third area A3 is connected to the other end portion of the auxiliary sensing line 122 of the second area A2 in the first sensing contact hole 148 of the first passivation layer 145 and the second sensing contact hole 155 at the boundary of the third area A3 through the connecting pattern 163. Accordingly, the first and third areas A1 and A3 are connected to each other through the x sensing lines xsl and the auxiliary sensing line 122 of the second area A2.

In FIGS. 3, 4 and 5, a buffer layer 105 of an inorganic insulating material such as silicon oxide ($SiO_2$) and silicon nitride (SiNx) is formed on a transparent substrate 101. When the substrate 101 is formed of a glass, a semiconductor layer 113 of polycrystalline silicon may be deteriorated by an alkali ion erupting from the substrate 101 and a property of a thin film transistor (TFT) Tr may be degraded. The deterioration of the semiconductor layer 113 is prevented by blocking the alkali ion with the buffer layer 105. In another embodiment, the buffer layer 105 may be omitted.

The semiconductor layer 113 including first and second semiconductor regions 113a and 113b is formed on the buffer layer 105 in the pixel region P. The first semiconductor region 113a of intrinsic polycrystalline silicon is disposed at a central portion of the semiconductor layer 113, and the second semiconductor region 113b of impurity-doped polycrystalline silicon is disposed at both sides of the first semiconductor region 113a. The first semiconductor region 113a functions as a channel of the TFT Tr, and the second semiconductor region 113b functions as source and drain regions of the TFT Tr.

A gate insulating layer 116 of an inorganic insulating material such as silicon oxide ($SiO_2$) and silicon nitride (SiNx) is formed on the semiconductor layer 113. A gate line 119 (of FIG. 2), an auxiliary sensing line 122 and a gate electrode 120 are formed on the gate insulating layer 116. The gate line 119, the auxiliary sensing line 122 and the gate electrode 120 may have a single-layered structure or a multi-layered structure of a metallic material. For example, the gate line 119, the auxiliary sensing line 122 and the gate electrode 120 may include at least one of aluminum (Al), aluminum alloy (e.g., aluminum neodymium (AlNd)), copper (Cu), copper alloy, molybdenum (Mo) and molybdenum alloy (e.g., molybdenum titanium (MoTi)).

The gate line 119 is parallel to and spaced apart from the auxiliary sensing line 122, and the gate electrode 120 is connected to the gate line 119. The gate electrode 120 corresponds to the first semiconductor region 113a of the semiconductor layer 113. Although not shown, a gate link line connected to the gate line 119 is formed on the gate insulating layer 116 in the non-active area NA, and a gate pad connected to the gate link line is formed on the gate insulating layer 116 in the pad area PA.

An interlayer insulating layer 123 of an inorganic insulating material such as silicon oxide ($SiO_2$) and silicon nitride (SiNx) is formed on the gate electrode 120, the gate line 119, the auxiliary sensing line 122, the gate link line and the gate pad. The interlayer insulating layer 123 and the gate insulating layer 116 have a semiconductor contact hole 125 exposing the second semiconductor region 113b of the semiconductor layer 113.

A data line 130, a source electrode 133 and a drain electrode 136 are formed on the interlayer insulating layer 123. The data line 130 crosses the gate line 119 to define the pixel region P. Further, the data line 130 may have a single-layered structure or a multi-layered structure of a metallic material. For example, the data line 130 may include at least one of aluminum (Al), aluminum alloy (e.g., aluminum neodymium (AlNd)), copper (Cu), copper alloy, molybdenum (Mo) and molybdenum alloy (e.g., molybdenum titanium (MoTi)). When the data line 130 has a multi-layered structure, the data line 130 may have a triple-layered structure that includes a first layer of one of molybdenum (Mo) and molybdenum titanium (MoTi), a second layer of one of aluminum (Al), aluminum alloy, copper (Cu) and copper alloy and a third layer of one of molybdenum (Mo) and molybdenum titanium (MoTi).

The source and drain electrodes 133 and 136 are spaced apart from each other and have the same layer and the same material as the data line 130. In addition, the source and drain electrodes 133 and 136 are connected to the second semiconductor region 113b through the semiconductor contact hole 125. The semiconductor layer 113, the gate insulating layer 116, the gate electrode 120, the interlayer insulating layer 123, the source electrode 133 and the drain electrode 136 constitute the TFT Tr. The TFT Tr is connected to the gate line 119 and the data line 130 such that the gate electrode 120 is connected to the gate line 119 and the source electrode 133 is connected to the data line 130.

Further, a data link line 131 connected to the data line 130 is formed on the interlayer insulating layer 123 in the non-active area NA, and a data pad 132 connected to the data link line 131 is formed on the interlayer insulating layer 123 in the pad area PA.

A first passivation layer 145 of an organic material such as benzocyclobutene (BCB) and acrylic resin is formed on the data line 130 and the source and drain electrodes 133 and 136. The first passivation layer 145 covers the active area AA and the non-active area NA except the pad area PA for planarization. Since the first passivation layer 145 does not cover the pad area PA, the data pad 132 and a portion of the data link line 131 in the pad area PA are exposed through the first passivation layer 145. Since the first passivation layer 145 is formed directly on the data line 130 and the source and drain electrodes 133 and 136 without an intervening auxiliary insulating layer, fabrication cost is reduced.

Although the data line 130 and the source and drain electrodes 133 and 136 of a metallic material directly contact the first passivation layer 145 of an organic material, adhesion property between the metallic material and the organic material is not deteriorated because the improved organic material has an excellent adhesion force to the metallic material. The first passivation layer 145 has a first drain contact hole 147 exposing the drain electrode 136 and a first sensing hole 148 exposing the interlayer insulating layer 123 corresponding to an end portion of the auxiliary sensing line 122.

A common electrode 150 of a transparent conductive material such as indium-tin-oxide (ITO) and indium-zinc-oxide (IZO) is formed on the first passivation layer 145 in the active area AA. The common electrode 150 has a first open area exposing the first passivation layer 145 over the TFT Tr in the pixel region P and a second open area oa2 exposing the first sensing hole 148. The common electrode 150 may have a plate shape corresponding to each touch block TB including the plurality of pixel regions P. For example, the common electrode 150 may include three plate patterns which are separated to correspond to the first to third areas A1 to A3 (of FIG. 2).

In addition, an etching preventing pattern 151 and a first auxiliary pad pattern 152 that have the same layer and the same material as the common electrode 150 are formed on the first passivation layer 145. The etching preventing pattern 151 covers an inside and a boundary of the first drain contact hole 147. Accordingly, the etching preventing pattern 151 contacts the first passivation layer 145 of the boundary and a sidewall of the first drain contact hole 147 and the drain electrode 136 exposed through the first drain contact hole 147.

The first auxiliary pad pattern 152 covers the data pad 132 and the portion of the data link line 131 exposed through the first passivation layer 145 in the pad area PA. Accordingly, the first auxiliary pad pattern 152 contacts the edge top surface and the sidewall surface of the first passivation layer 145 in the pad area PA, the data pad 132 and the portion of the data link line 131. Each of the etching preventing pattern 151 and the first auxiliary pad pattern 152 has an island shape spaced apart from the common electrode 150.

Here, the drain electrode 136 exposed through the first drain contact hole 147 is covered with the etching preventing pattern 151 and the portion of the data link line 131 and the data pad 132 exposed in the pad area PA outside the first passivation layer 145 is covered with the first auxiliary pad pattern 152. As a result, exposition of the drain electrode 136, the portion of the data link line 131 and the data pad 132 to an etching solution for the common electrode 150 is prevented while a transparent material layer (not shown) is patterned. In addition, exposition of the drain electrode 136, the portion of the data link line 131 and the data pad 132 to an etching solution for the x and y sensing lines xsl and ysl is prevented while a metallic material layer (not shown) is patterned in a subsequent process. Accordingly, deterioration of the drain electrode 136, the portion of the data link line 131 and the data pad 132 is prevented without an additional auxiliary insulating layer under the first passivation layer 145.

An x sensing line xsl and a y sensing line ysl are formed on the common electrode 150. The x sensing line xsl may overlap the gate line 119 and the y sensing line ysl may overlap the data line 130. In addition, the x and y sensing lines xsl and ysl may have a single-layered structure or a multi-layered structure of a metallic material. For example, the x and y sensing lines xsl and ysl may include at least one of aluminum (Al), aluminum alloy (e.g., aluminum neodymium (AlNd)), copper (Cu), copper alloy, molybdenum (Mo) and molybdenum alloy (e.g., molybdenum titanium (MoTi)). In each touch block TB, an end portion of the x sensing line xsl and an end portion of the auxiliary sensing line 122 are disposed in the first sensing contact hole 148.

Since the x and y sensing lines xsl and ysl have the same layer and the same material as each other, the x and y sensing lines xsl and ysl are electrically connected to each other in each of the first to third areas A1 to A3 of each touch block TB. However, since the x sensing lines xsl of the first and third areas A1 and A3 are electrically separated from the x sensing lines xsl of the second area A2, the x sensing lines xsl of the first and third areas A1 and A3 may be used for detecting an x coordinate of a touch point for each touch block TB and the y sensing line ysl of the second area A2 may be used for detecting a y coordinate of a touch point of each touch block TB.

The drain electrode 136 exposed through the first drain contact hole 147 is covered with the etching preventing pattern 151, and the portion of the data link line 131 and the data pad 132 exposed in the pad area PA outside the first passivation layer 145 is covered with the first auxiliary pad pattern 152. As a result, exposition of the drain electrode 136, the portion of the data link line 131 and the data pad 132 to an etching solution for the x sensing line xsl and the y sensing line ysl is prevented while a metallic material layer (not shown) is patterned. Accordingly, deterioration of the drain electrode 136, the portion of the data link line 131 and the data pad 132 is prevented without an additional auxiliary insulating layer under the first passivation layer 145.

A second passivation layer 155 of an inorganic insulating material such as silicon oxide ($SiO_2$) and silicon nitride (SiNx) is formed on the common electrode 150, the x sensing line xsl and the y sensing line ysl. The second passivation layer 155 has a second drain contact hole 157 exposing the etching preventing pattern 152 and a data pad contact hole 159 exposing the first auxiliary pad pattern 152 on the data pad 132 in the pad area PA. In addition, the second passivation layer 155 and the interlayer insulating layer 123 have a gate pad contact hole (not shown) exposing a gate pad (not shown) and a second sensing contact hole 158 exposing both the end portion of the auxiliary sensing line 122 and the end portion of the x sensing line xsl adjacent to each other by patterning the second passivation layer 155 and the interlayer insulating layer 123 together. The first and second sensing contact holes 148 and 158 are communicated with each other.

A pixel electrode 160 of a transparent conductive material such as indium-tin-oxide (ITO) and indium-zinc-oxide (IZO) is formed on the second passivation layer 155 in the pixel region P. The pixel electrode 160 is connected to the etching preventing pattern 151 through the second drain contact hole 157. In addition, the pixel electrode 160 has a plurality of third open areas oa3 for generating a fringe field with the common electrode 150 when a driving voltage is applied. Each of the plurality of third open areas oa3 may have a bar shape.

In addition, a gate pad terminal (not shown) and a data pad terminal 165 having the same layer and the same material as the pixel electrode 160 are formed on the second passivation layer 155 in the pad area PA. The gate pad terminal contacts the gate pad through the gate pad contact hole and the data pad terminal 165 contacts the first auxiliary pad pattern 152 through the data pad contact hole 159.

Further, a connecting pattern 163 having the same layer and the same material as the pixel electrode 160 is formed on the second passivation layer 155 in each touch block TB. The connecting pattern 163 having an island shape contacts both of the end portion of the auxiliary sensing line 122 and the end portion of the x sensing line xsl in the first and second sensing contact holes 148 and 158.

The pixel electrode 160 and the common electrode 150 overlap each other in the pixel region P with the second passivation layer 155 interposed therebetween, and the common electrode 150, the second passivation layer 155 and the pixel electrode 160 overlapping one another constitute a storage capacitor.

FIGS. 6A to 6J are cross-sectional views showing an array substrate of a pixel region for an in-cell type touch sensor liquid crystal display device according to an embodiment of the present invention, FIGS. 7A to 7J are cross-sectional view showing a method of fabricating an array substrate of a pad area for an in-cell type touch sensor liquid crystal display device according to an embodiment of the present invention, and FIGS. 8A to 8J are cross-sectional views showing an array substrate of an end portion of a touch block for an in-cell type touch sensor liquid crystal display device according to an embodiment of the present invention.

Figure 6A:
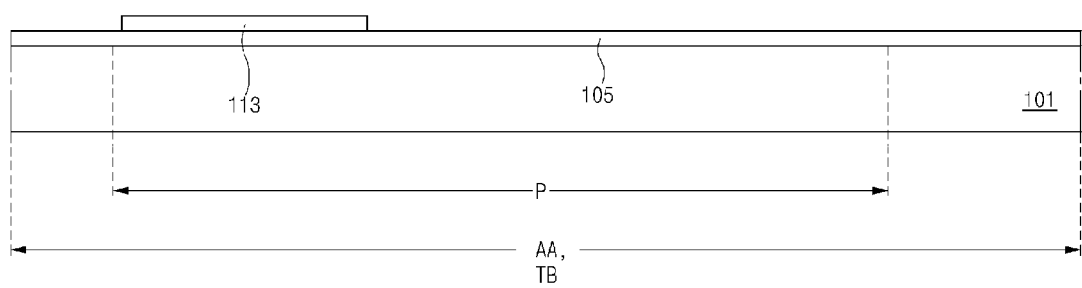
FIGS. 6A to 6J are cross-sectional views showing an array substrate of a pixel region for an in-cell type touch sensor liquid crystal display device according to an embodiment of the present invention.
Figure 7A:
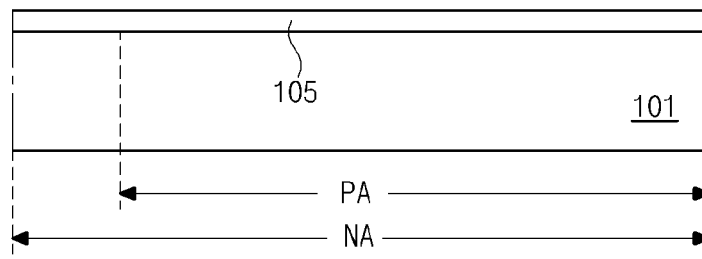
FIGS. 7A to 7J are cross-sectional view showing a method of fabricating an array substrate of a pad area for an in-cell type touch sensor liquid crystal display device according to an embodiment of the present invention.
Figure 8A:
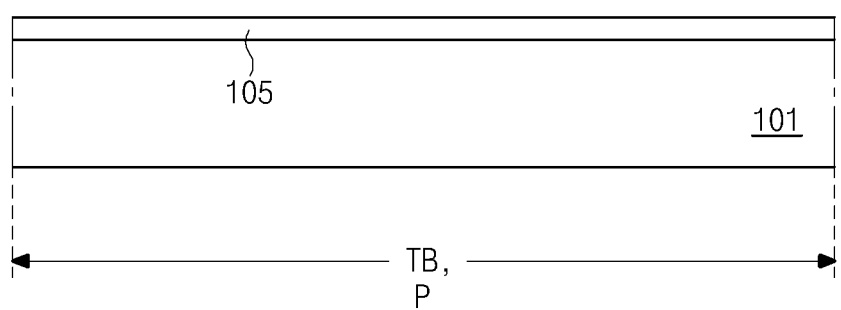
FIGS. 8A to 8J are cross-sectional views showing an array substrate of an end portion of a touch block for an in-cell type touch sensor liquid crystal display device according to an embodiment of the present invention.

In FIGS. 6A, 7A and 8A, a buffer layer 105 is formed on a transparent substrate 101 by depositing an inorganic insulating material such as silicon oxide ($SiO_2$) and silicon nitride (SiNx). When amorphous silicon layer on the substrate 101 is crystallized into polycrystalline silicon by a laser irradiation or a heat treatment, an alkali ion may erupt from the substrate 101 of a glass and a semiconductor layer 113 may be deteriorated by the alkali ion. The deterioration of the semiconductor layer 113 is prevented by blocking the alkali ion with the buffer layer 105. In another embodiment, the buffer layer 105 may be omitted.

An intrinsic amorphous silicon layer (not shown) is formed on the buffer layer 105 by depositing intrinsic amorphous silicon, and the intrinsic amorphous silicon layer is crystallized into a polycrystalline silicon layer (not shown) through one of an excimer laser annealing (ELA) method using an excimer laser, a sequential lateral solidification (SLS) method, solid phase crystallization (SPC) method and an alternating magnetic field crystallization (AMFC) method. Next, the semiconductor layer 113 of intrinsic polycrystalline silicon is formed in a pixel region P by patterning the polycrystalline silicon layer through a photolithographic process.

Figure 6B:
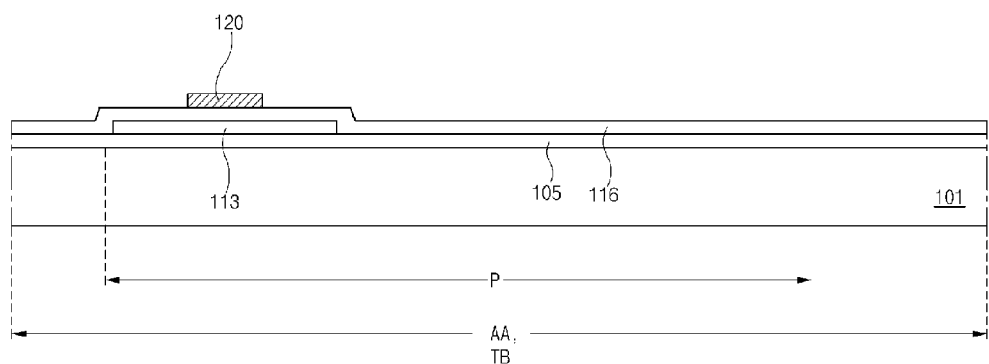
Figure 7B:
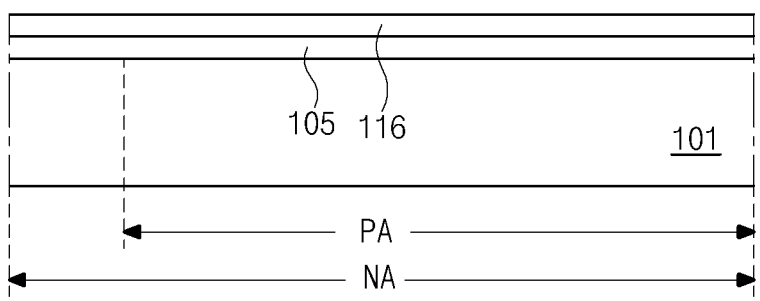
Figure 8B:
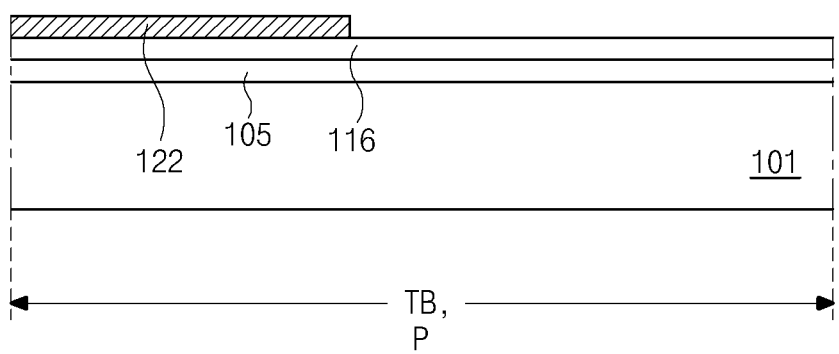

In FIGS. 6B, 7B and 8B, a gate insulating layer 116 is formed on the semiconductor layer 113 by depositing an inorganic insulating material such as silicon oxide ($SiO_2$) and silicon nitride (SiNx). Next, a first metal layer (not shown) is formed on the gate insulating layer 116 by depositing at least one metallic material such as aluminum (Al), aluminum alloy (e.g., aluminum neodymium (AlNd)), copper (Cu), copper alloy, molybdenum (Mo) and molybdenum alloy (e.g., molybdenum titanium (MoTi)). The first metal layer may have a single-layered structure or a multi-layered structure.

Next, a gate electrode 120, a gate line 119 (of FIG. 2) and an auxiliary sensing line 122 are formed on the gate insulating layer 116 by patterning the first metal layer through a photolithographic process. The gate electrode 120 corresponds to the semiconductor layer 113. The gate line 119 is connected to the gate electrode 120 and extends along a first direction at a boundary of the pixel region P. In addition, the auxiliary sensing line 122 is parallel to and spaced apart from the gate line 119 in each touch block TB. Although not shown, a gate link line connected to the gate line 119 is formed on the gate insulating layer 116 in a non-active area NA, and a gate pad connected to the gate link line is formed on the gate insulating layer 116 in a pad area PA.

Figure 6C:
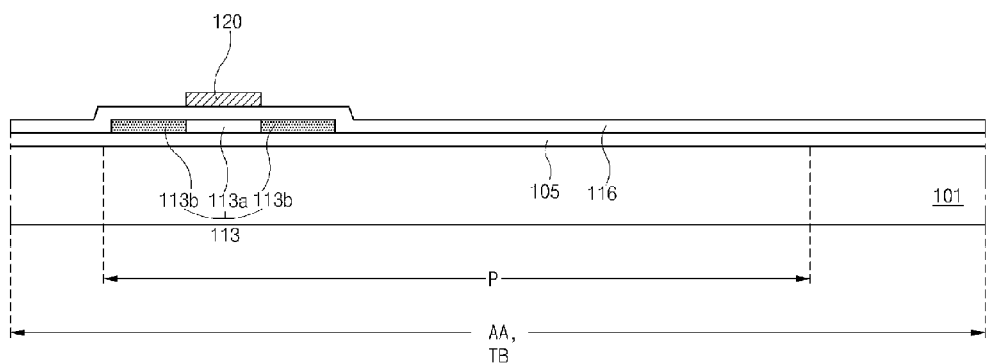
Figure 7C:
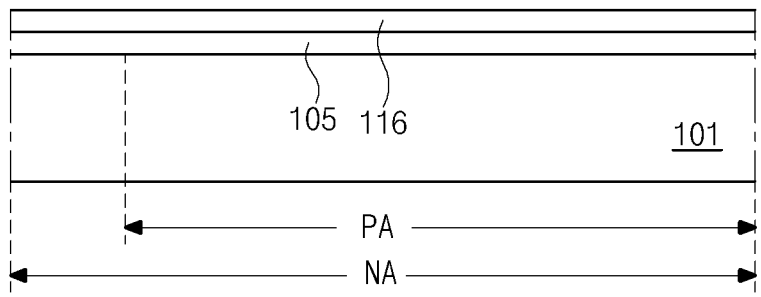
Figure 8C:
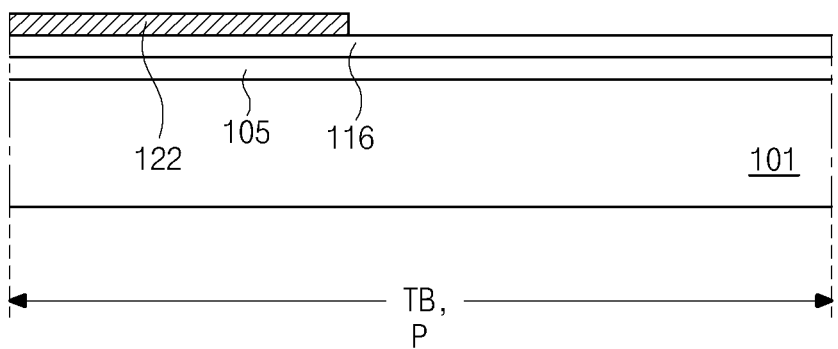

In FIGS. 6C, 7C and 8C, first and second semiconductor regions 113a and 113b are formed by doping the semiconductor layer 113 with impurities using the gate electrode 120 as a doping mask. Accordingly, the first semiconductor region 113a of intrinsic polycrystalline silicon corresponds to the gate electrode 120 and the second semiconductor region 113b of impurity-doped polycrystalline silicon is disposed at both sides of the first semiconductor region 113a.

Figure 6D:
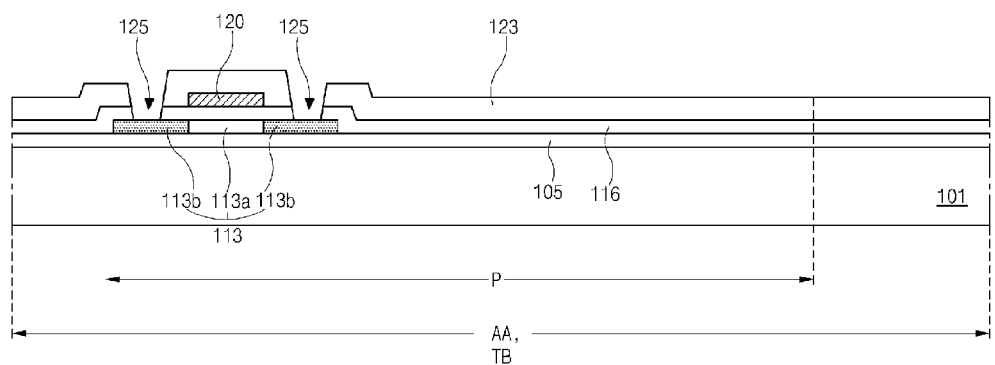
Figure 7D:
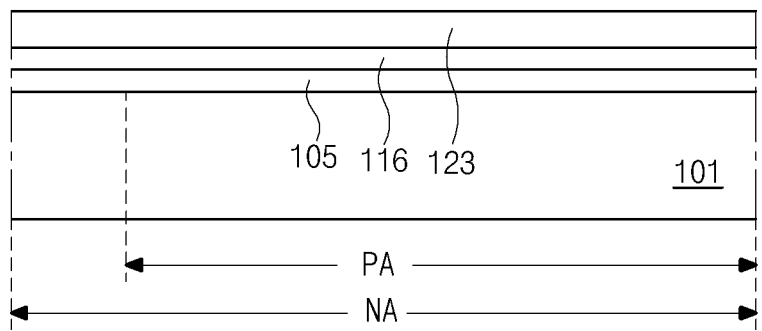
Figure 8D:
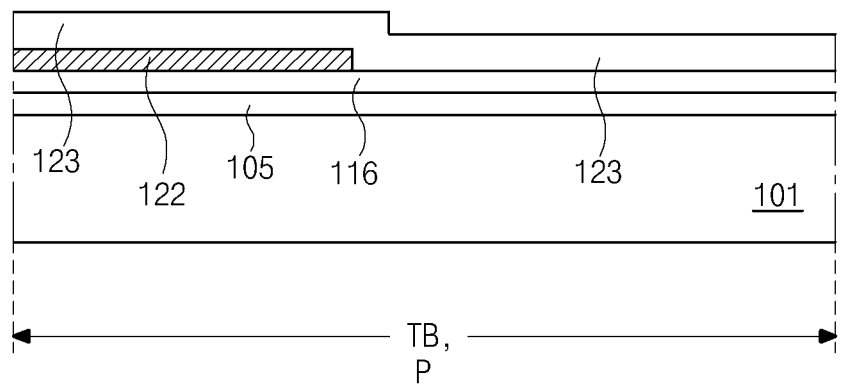

In FIGS. 6D, 7D and 8D, an interlayer insulating layer 123 is formed on the gate electrode 120, the gate line 119, the auxiliary sensing line 122, the gate link line and the gate pad by depositing an inorganic insulating material such as silicon oxide ($SiO_2$) and silicon nitride (SiNx). Next, a semiconductor contact hole 125 exposing the second semiconductor region 113b of the semiconductor layer 113 is formed by patterning the interlayer insulating layer 123 and the gate insulating layer 116.

Figure 6E:
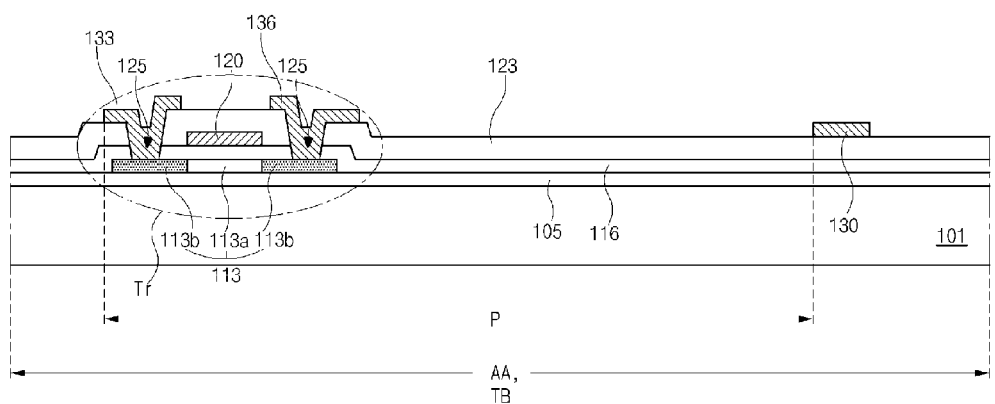
Figure 7E:
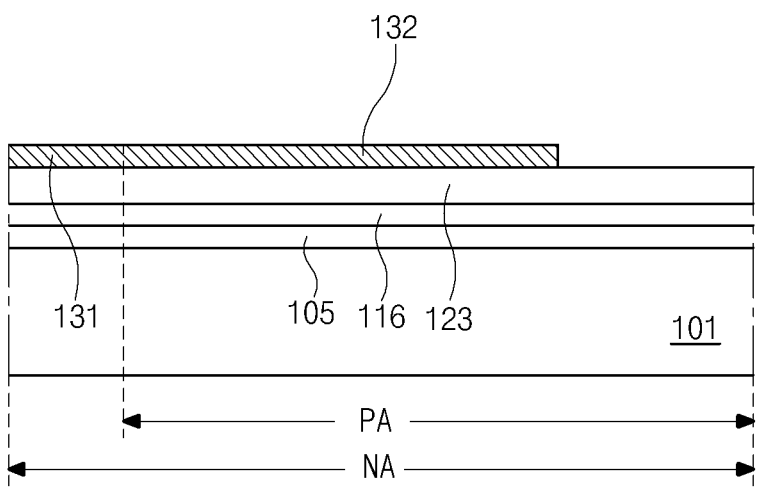
Figure 8E:
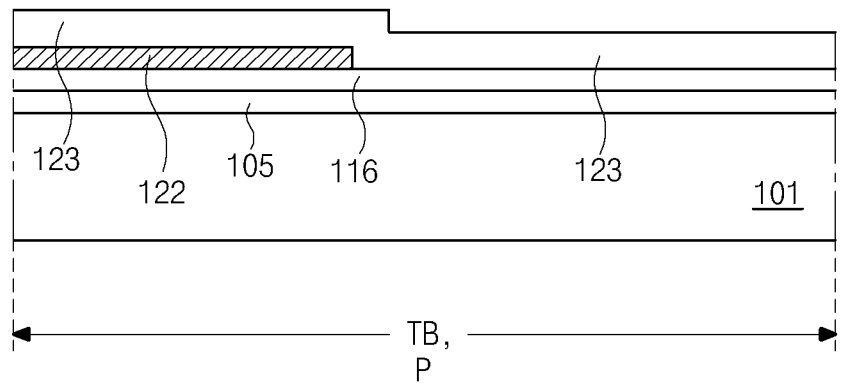

In FIGS. 6E, 7E and 8E, a second metal layer (not shown) is formed on the interlayer insulating layer 123 by depositing at least one metallic material such as aluminum (Al), aluminum alloy (e.g., aluminum neodymium (AlNd)), copper (Cu), copper alloy, molybdenum (Mo) and molybdenum alloy (e.g., molybdenum titanium (MoTi)). The second metal layer may have a single-layered structure or a multi-layered structure.

Next, a data line 130, a source electrode 133, a drain electrode 133, a data link line 131 and a data pad 132 are formed on the interlayer insulating layer 123 by patterning the second metal layer through a photolithographic process. The source and drain electrodes 133 and 136 are connected to the second semiconductor region 113b through the semiconductor contact hole 125. The semiconductor layer 113, the gate insulating layer 116, the gate electrode 120, the interlayer insulating layer 123, the source electrode 133 and the drain electrode 136 constitute a thin film transistor (TFT) Tr of a switching element in the pixel region P. The data line 130 is connected to the source electrode 133 and crosses the gate line 110 to define the pixel region P. In addition, the data link line 131 in the non-active area NA is connected to the data line 130, and the data pad 132 in the pad area PA is connected to the data link line 131.

Figure 6F:
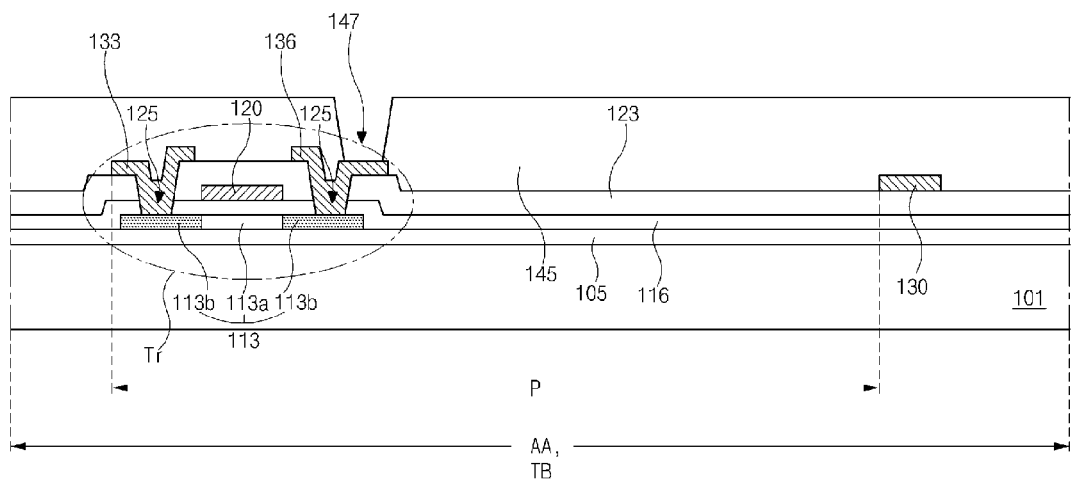
Figure 7F:
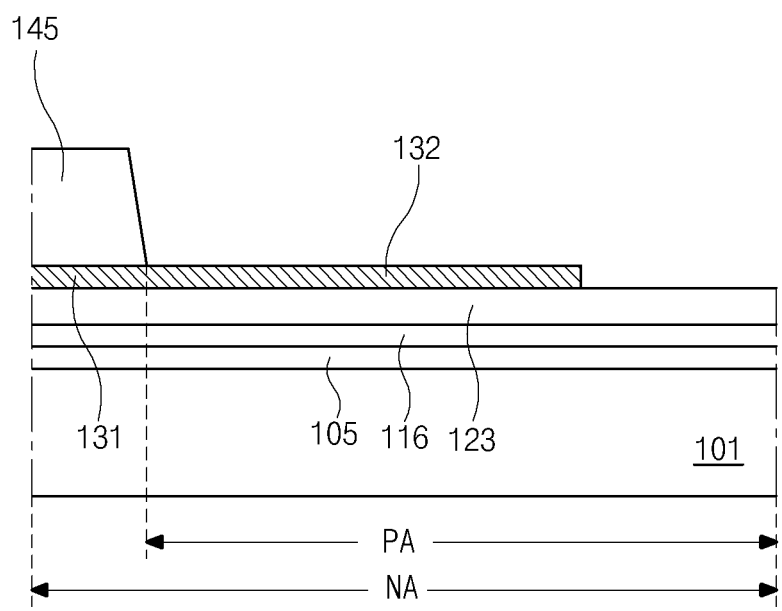
Figure 8F:
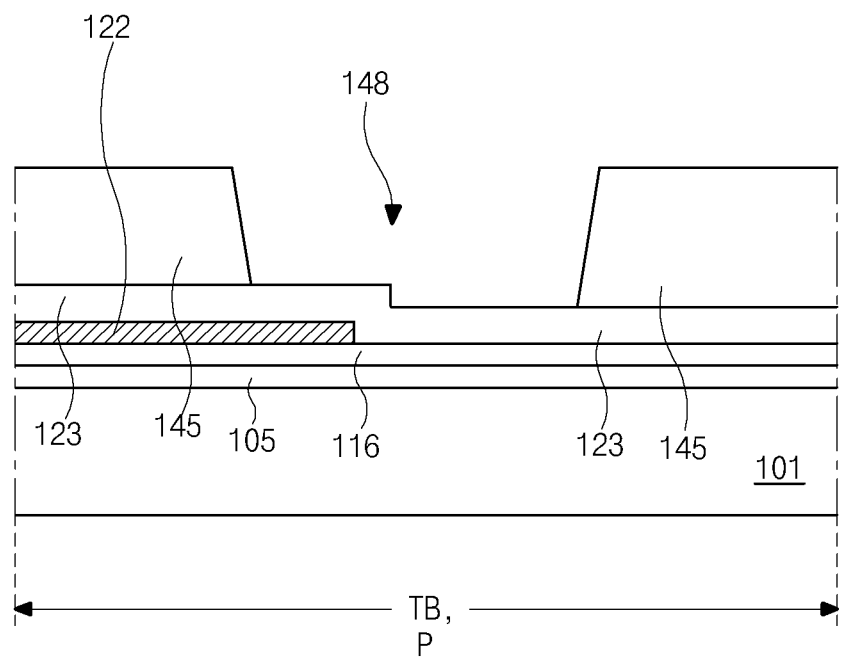

In FIGS. 6F, 7F and 8F, a first passivation layer 145 is formed on the TFT Tr, the data line 130, the data link line 131 and the data pad 132 by coating an organic material such as benzocyclobutene (BCB) and acrylic resin. Next, a first drain contact hole 147 exposing the drain electrode 136 and a first sensing hole 148 exposing the interlayer insulating layer 123 corresponding to an end portion of the auxiliary sensing line 122 are formed by patterning the first passivation layer 145 through a photolithographic process. At the same time, the first passivation layer 145 in the pad area PA is removed. When the first passivation layer 145 has a photosensitive property, an etching step of the photolithographic process may be omitted. As a result, the first passivation layer 145 having a flat top surface for planarization covers the active area AA and the non-active area NA except the pad area PA.

Figure 6G:
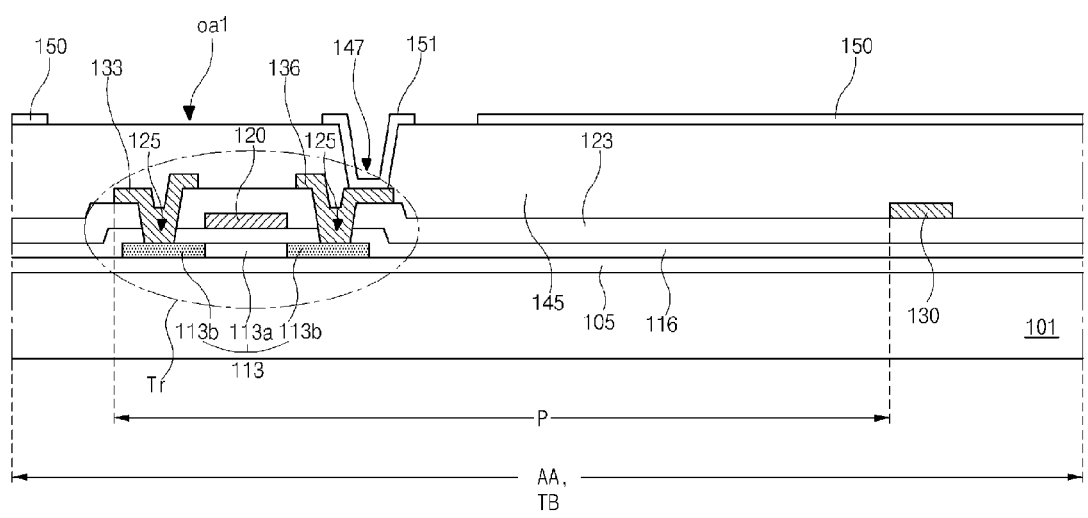
Figure 6J:
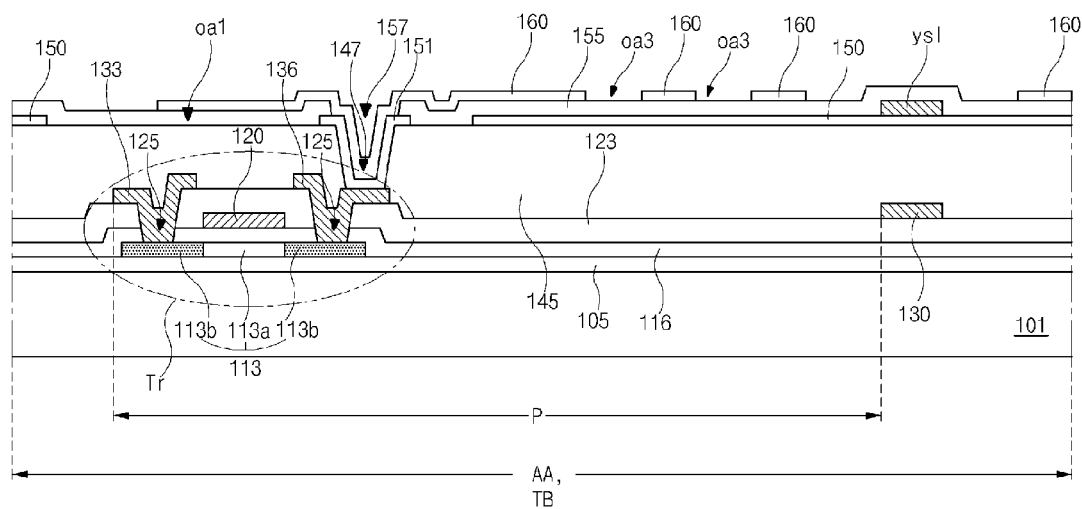
Figure 7G:
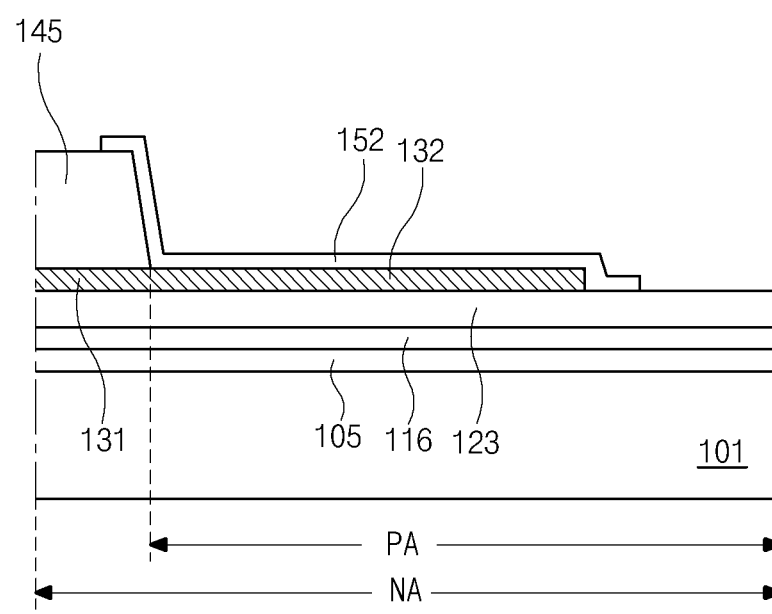
Figure 8G:
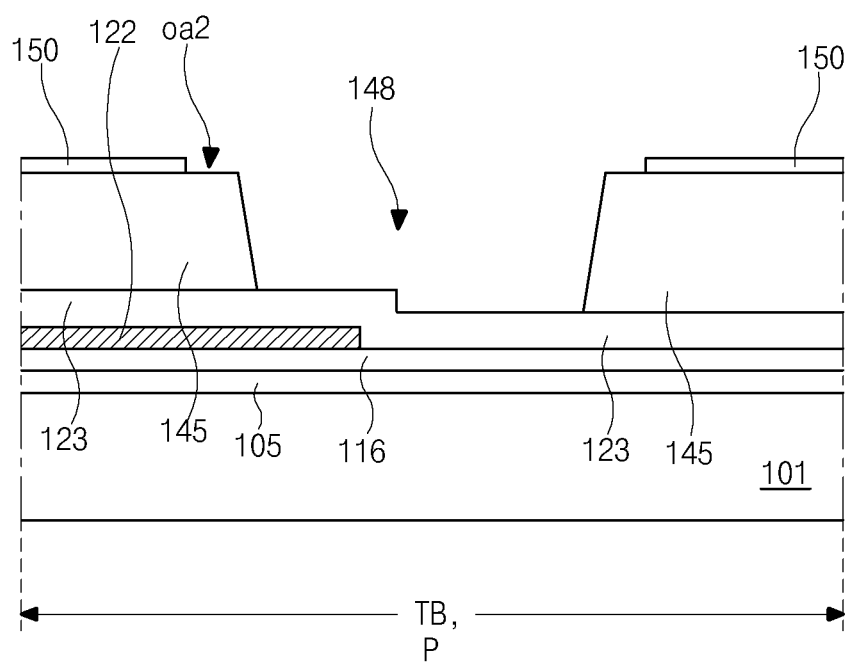

In FIGS. 6G, 7G and 8G, a common electrode 150, an etching preventing pattern 151 and a first auxiliary pad pattern 152 are formed on the first passivation layer 145 by depositing and patterning a transparent conductive material such as indium-tin-oxide (ITO) and indium-zinc-oxide (IZO). The common electrode 150 has a first open area exposing the first passivation layer 145 over the TFT Tr in the pixel region P and a second open area oa2 exposing the first sensing hole 148. The first open area is formed to prevent an electric shortage between a pixel electrode 160 (of FIG. 6J) and the common electrode 150, and the second open area oa2 is formed to prevent an electric shortage between a connecting pattern 163 (of FIG. 8J) and the common electrode 150. The second open area oa2 may have an area greater than the first sensing contact hole 148.

Each of the etching preventing pattern 151 and the first auxiliary pad pattern 152 are electrically separated from the common electrode. The etching preventing pattern 151 covers a boundary of the first drain contact hole 147 as well as the first drain contact hole 147, and the first auxiliary pad pattern 152 covers a boundary of the data pad 132 and the portion of the data link line 131 exposed outside the first passivation layer 145 as well as the data pad 132 and a portion of the data link line 131. In addition, the etching preventing pattern 151 contacts a boundary top surface and a sidewall surface of the first passivation layer 145 and the drain electrode 136, and the first auxiliary pad pattern 152 contacts an edge top surface and a sidewall surface of the first passivation layer 145 in the pad area PA, the data pad 132 and the portion of the data link line 131. Accordingly, the etching preventing pattern 151 has an island shape completely covering the drain electrode 136, and the first auxiliary pad pattern 152 has an island shape completely covering the data pad 132 and the portion of the data link line 131. The deterioration of the drain electrode 136, the portion of the data link line 131 and the data pad 132 is prevented without an additional auxiliary insulating layer under the first passivation layer 145 due to the etching preventing pattern 151 and the first auxiliary pad pattern 152.

Figure 6H:
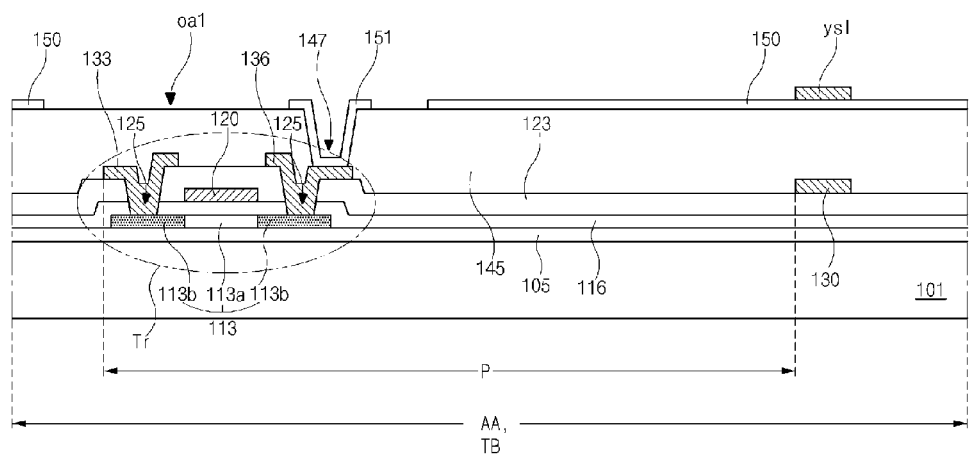
Figure 7H:
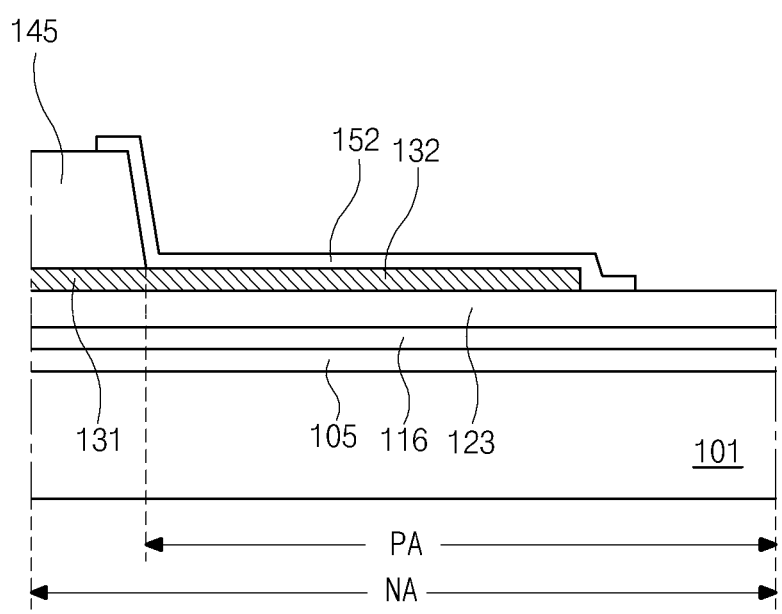
Figure 8H:
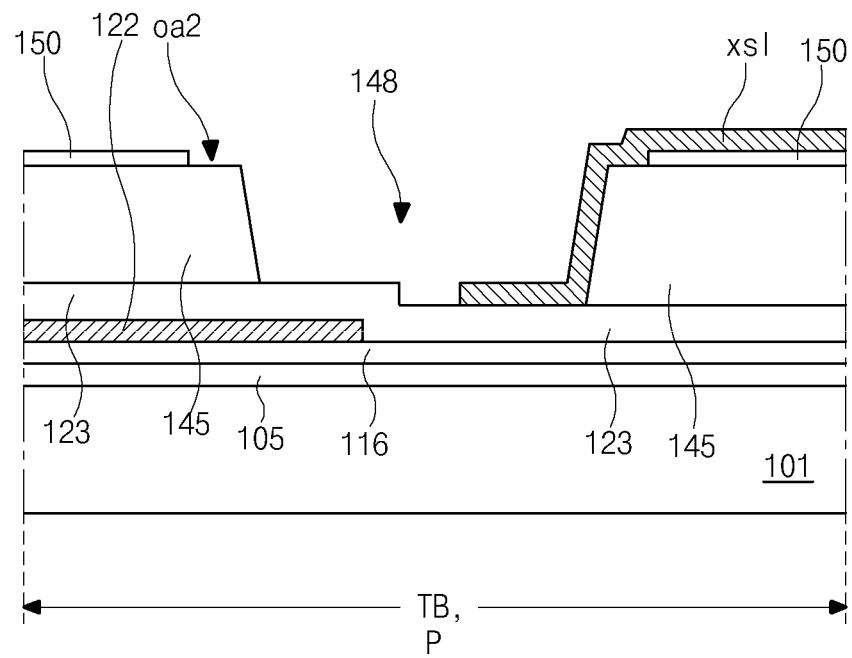

In FIGS. 6H, 7H and 8H, a third metal layer (not shown) is formed on the common electrode 150, the etching preventing pattern 151 and the first auxiliary pad pattern 152 by depositing at least one of aluminum (Al), aluminum alloy (e.g., aluminum neodymium (AlNd)), copper (Cu), copper alloy, molybdenum (Mo) and molybdenum alloy (e.g., molybdenum titanium (MoTi)). The third metal layer may have a single-layered structure or a multi-layered structure. Next, an x sensing line xsl and a y sensing line ysl are formed on the common electrode 150 by patterning the third metal layer through a photolithographic process. The x sensing line xsl and the y sensing line ysl overlap the gate line 119 and the data line 130, respectively. The x sensing line xsl may have a bar shape in each touch block TB and an end portion of the x sensing line xsl may be bent to be disposed adjacent to the end portion of the auxiliary sensing line 122 in the first sensing contact hole 148.

The drain electrode 136 exposed through the first drain contact hole 147 is completely covered with the etching preventing pattern 151, and the portion of the data link line 131 and the data pad 132 exposed in the pad area PA outside the first passivation layer 145 is completely covered with the first auxiliary pad pattern 152. As a result, the drain electrode 136, the portion of the data link line 131 and the data pad 132 is not exposed to an etching solution for patterning the third metal layer. Accordingly, deterioration of the drain electrode 136, the portion of the data link line 131 and the data pad 132 is prevented without an additional auxiliary insulating layer under the first passivation layer 145.

Figure 6I:
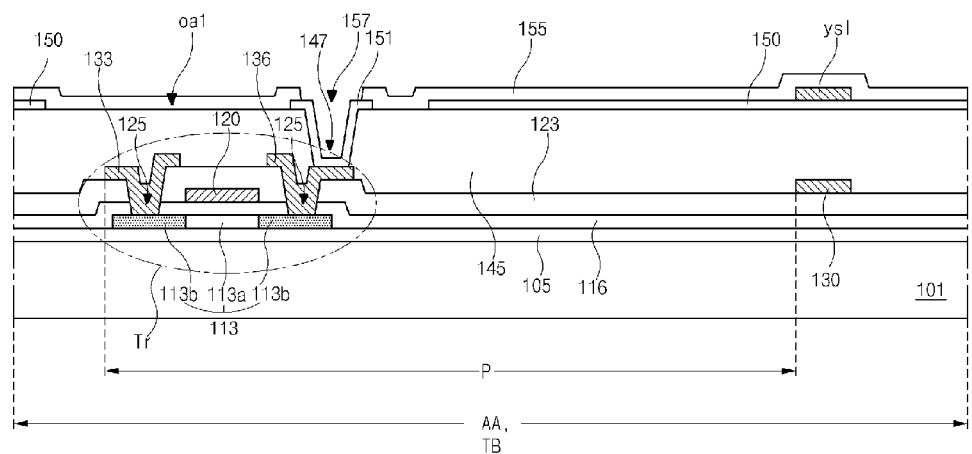
Figure 7I:
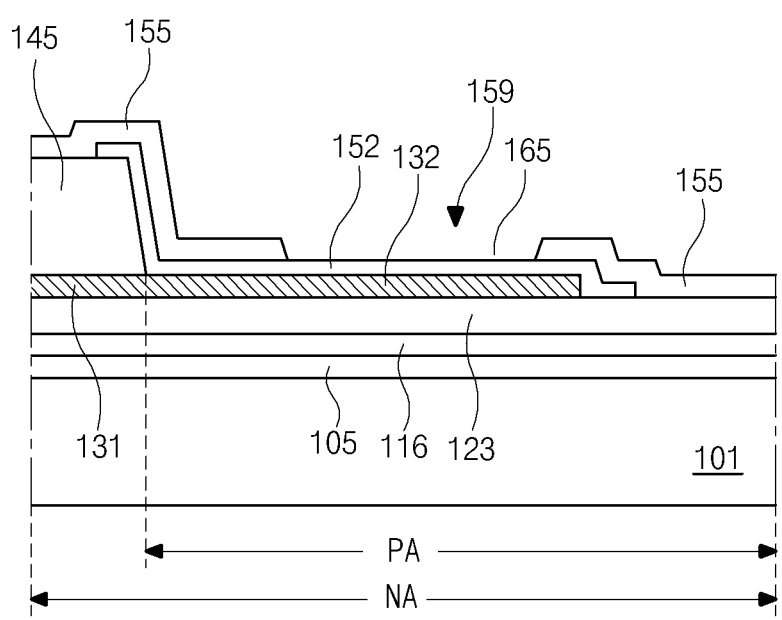
Figure 8I:
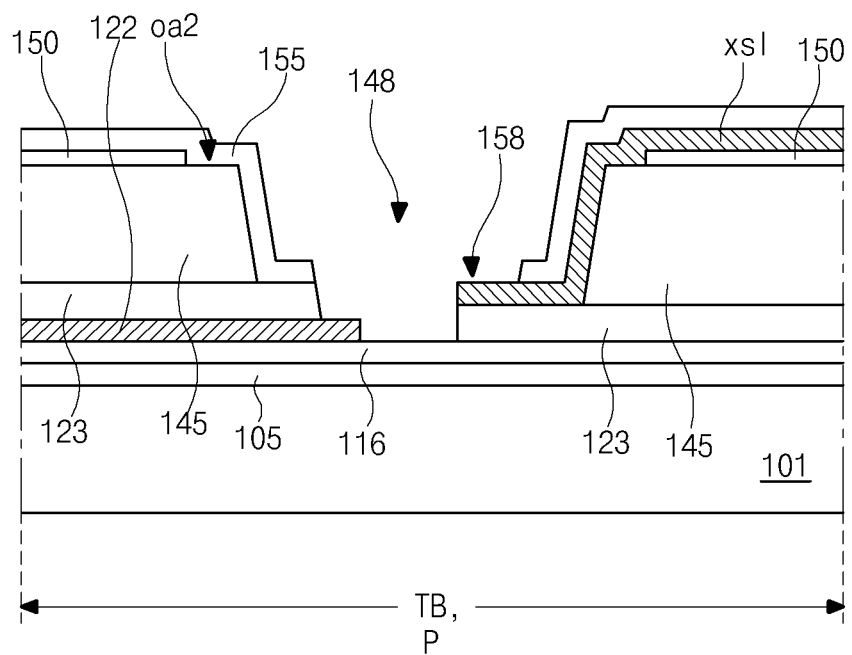

In FIGS. 6I, 7I and 8I, a second passivation layer 155 is formed on the x sensing line xsl and the y sensing line ysl by depositing an inorganic insulating material such as silicon oxide ($SiO_2$) and silicon nitride (SiNx). Next, a second drain contact hole 157 exposing the etching preventing pattern 151 and a second data pad contact hole 159 exposing the first auxiliary pad pattern 152 are formed by patterning the second passivation layer 155 through a photolithographic process. At the same time, a second sensing contact hole 158 exposing both the end portion of the auxiliary sensing line 122 and the end portion of the x sensing line xsl adjacent to each other and a gate pad contact hole (not shown) exposing the gate pad (not shown) are formed by patterning the second passivation layer 155 and the interlayer insulating layer 123.

Figure 7J:
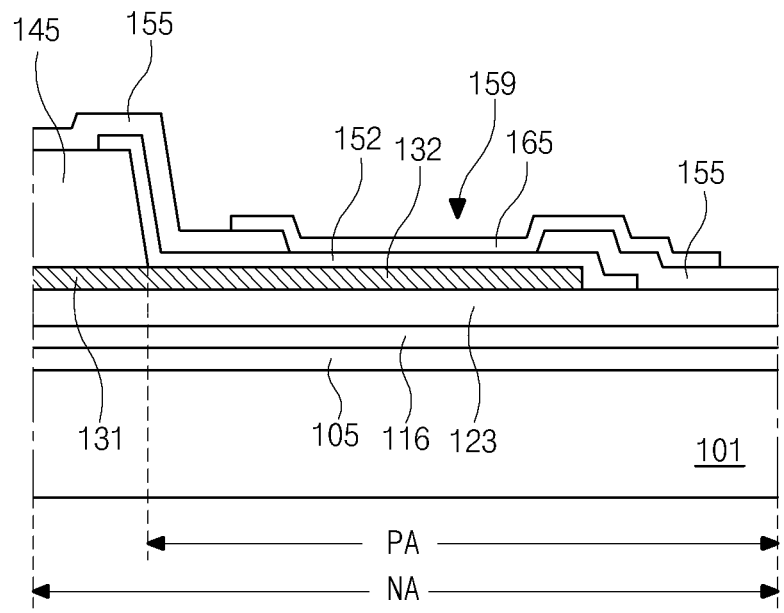
Figure 8J:
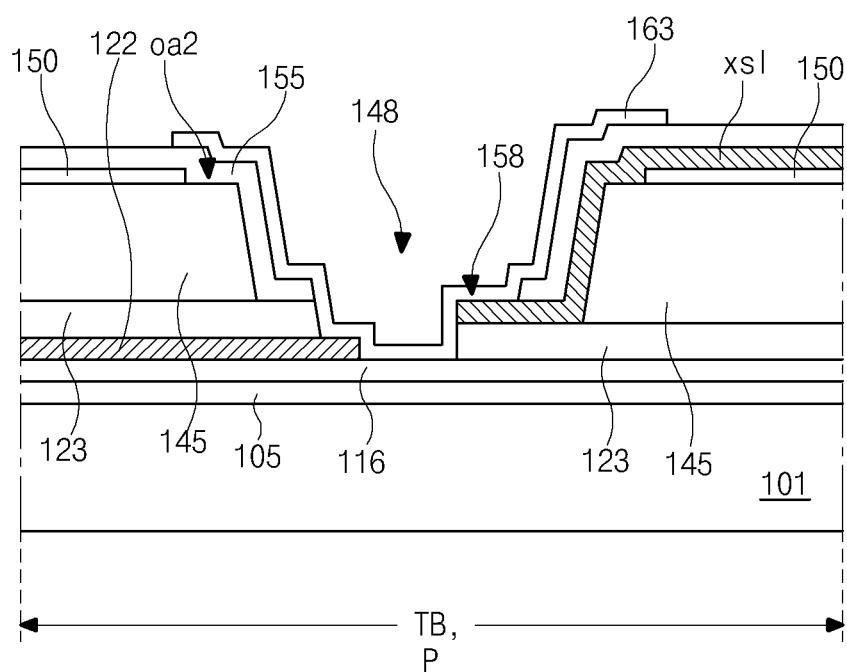

In FIGS. 6J, 7J and 8J, a transparent conductive material layer (not shown) is formed on the second passivation layer 155 by depositing a transparent conductive material such as indium-tin-oxide (ITO) and indium-zinc-oxide (IZO). Next, a pixel electrode 160, a connecting pattern 163, a gate pad terminal (not shown) and a data pad terminal (not shown) are formed on the second passivation layer 155 by patterning the transparent conductive material layer through a photolithographic process, thereby an array substrate for an in-cell type touch sensor liquid crystal display device completed. The pixel electrode 160 has a plurality of third open areas oa3 for generating a fringe field with the common electrode 150 when a driving voltage is applied. Each of the plurality of third open areas oa3 may have a bar shape.

The pixel electrode 160 contacts the etching preventing pattern 151 through the second drain contact hole 157, and the connecting pattern 163 contacts both of the end portion of the auxiliary sensing line 122 and the end portion of the x sensing line xsl in the first and second sensing contact holes 148 and 158. In addition, the gate pad terminal contacts the gate pad through the gate pad contact hole in the pad area PA and the data pad terminal 165 contacts the first auxiliary pad pattern 152 through the data pad contact hole 159.

The array substrate for an in-cell type touch sensor liquid crystal display device may be attached to a color filter substrate (not shown) and a liquid crystal layer (not shown) may be formed between the array substrate and the color filter substrate. Next, an x sensing circuit (not shown) and a y sensing circuit (not shown) may be connected to the x sensing line xsl and the y sensing line ysl, respectively, thereby an in-cell type touch sensor liquid crystal display (LCD) device is completed. When a finger of a user touches a position in the pixel region P of the in-cell type touch sensor LCD device, a capacitance between the common electrode 150 and the pixel electrode 160 is changed and voltages of the common electrode 150 and the pixel electrode 160 are changed. The changed voltages of the common electrode 150 and the pixel electrode 160 are transmitted to the x sensing circuit through the x sensing line xsl and the y sensing circuit through the y sensing line ysl. The position touched is detected by analyzing the changed voltages and an operation corresponding to a menu displayed in the position is performed.

Consequently, in an array substrate for an in-cell type touch sensor LCD device according to the present disclosure, an etching preventing pattern and a first auxiliary pad pattern are simultaneously formed with a common electrode. In addition, a drain electrode exposed through a first drain contact hole is completely covered with the etching preventing pattern and a data pad exposed outside a first passivation layer is completely covered with the first auxiliary pad pattern. Accordingly, deterioration of the drain electrode and the data pad due to an etching solution for x and y sensing lines is prevented without an additional auxiliary insulating layer under a first passivation layer. As a result, deterioration of contact property in contact holes is prevented and production yield is improved. In addition, since the additional auxiliary insulating layer is omitted, material cost is reduced and productivity is improved.

It will be apparent to those skilled in the art that various modifications and variations can be made in an array substrate for an in-cell type touch sensor liquid crystal display device and a method of fabricating the array substrate of the present disclosure without departing from the sprit or scope of the invention. Thus, it is intended that the present invention covers the modifications and variations of this invention provided they come within the scope of the appended claims and their equivalents.

What is claimed is:

1. A method of fabricating an array substrate for an in-cell type touch sensor liquid crystal display device, the method comprising:
forming a gate line, an auxiliary sensing line, a data line, and a thin film transistor on a substrate including a plurality of touch blocks each including a plurality of pixel regions, the gate line and the data line crossing each other with an interlayer insulating layer interposed therebetween to define each of the plurality of pixel regions, the auxiliary sensing line formed under the interlayer insulating layer, and the thin film transistor connected to the gate line and the data line;
forming a first passivation layer on the thin film transistor, the first passivation layer having a first drain contact hole exposing a drain electrode of the thin film transistor;
forming a common electrode and an etching preventing pattern on the first passivation layer, the common electrode disposed in each of the plurality of touch blocks, the etching preventing pattern spaced apart from the common electrode, and the etching preventing pattern having an area greater than the drain contact hole to completely cover the drain electrode;
forming an x sensing line and a y sensing line on the common electrode, the x sensing line overlapping the gate line and the y sensing line overlapping the data line;
forming a second passivation layer on the x sensing line and the y sensing line, the second passivation layer having a second drain contact hole exposing the etching preventing pattern; and
forming a pixel electrode and a connecting pattern on the second passivation layer in each of the plurality of pixel regions, the pixel electrode contacting the etching preventing pattern through the second drain contact hole and having a plurality of open areas each having a bar shape,
wherein the first passivation layer has a first sensing hole exposing the interlayer insulating layer corresponding to an end portion of the x sensing line,
wherein the second passivation layer has a second sensing hole exposing the end portion of the x sensing line in the first contact hole,
wherein the interlayer insulating layer has a third sensing hole exposing an end portion of the auxiliary sensing line, and
wherein the connecting pattern contacts the end portion of the x sensing line and the end portion of the auxiliary sensing line.

2. The method according to claim 1, wherein:
adjacent two of the plurality of touch blocks along a first direction parallel to the gate line are connected to each other through the x sensing line;
each of the plurality of touch blocks includes first, second, and third areas;
the second areas of adjacent two of the plurality of touch blocks along a second direction parallel to the data line are connected to the y sensing line; and
the common electrode include three plate patterns separated in the first, second and third areas.

3. The method according to claim 2, wherein:
the x sensing line of the first area is separated from the x sensing line of the second area; and
the x sensing line of the second area is separated from the x sensing line of the third area.

4. The method according to claim 3, wherein:
the auxiliary sensing line is formed in the second area of each of the plurality of touch blocks to be parallel to the gate line;
the auxiliary sensing line has a same layer and a same material as the gate line; and
the x sensing line of the first area and the x sensing line of the third area are connected to each other through the auxiliary sensing line.

5. The method according to claim 1, wherein:
the common electrode has a first open area corresponding to the thin film transistor and a second open area corresponding to the first sensing hole; and
an area of the second open area is greater than an area of the first open area.

6. The method according to claim 5, wherein:
the plurality of touch blocks arranged along the first direction are electrically connected to each other through the x sensing line; and
the plurality of touch blocks arranged along the second direction are electrically connected to each other through the y sensing line.

7. The method according to claim 1, further comprising:
forming a gate link line and a gate pad connected to the gate link line together with the gate line;
forming a data link line and a data pad connected to the data link line together with the data line; and
forming a first auxiliary pad pattern together with the common electrode,
wherein the substrate includes an active area displaying an image and a non-active area surrounding the active area,
wherein the non-active area display area includes a pad area,
wherein the gate link line and the data link line are disposed in the non-active area,
wherein the gate pad and the data pad are disposed in the pad area,
wherein the gate pad and the data pad are exposed outside the first passivation, and
wherein the first auxiliary pad pattern completely covers the gate pad and the data pad.

8. The method according to claim 7, further comprising:
forming a gate pad terminal and a data pad terminal together with the pixel electrode,
wherein the second passivation layer has a data pad contact hole exposing the first auxiliary pad pattern,
wherein the second passivation layer and the interlayer insulating layer have a gate pad contact hole exposing the gate pad,
wherein the gate pad terminal contacts the gate pad through the gate pad contact hole, and
wherein the data pad terminal contacts the first auxiliary pad pattern through the data pad contact hole.

9. The method according to claim 1, wherein forming the thin film transistor comprises:
forming an intrinsic amorphous silicon layer on the substrate;
crystallizing the intrinsic amorphous silicon layer into a polycrystalline silicon layer;
patterning the polycrystalline silicon layer to form a semiconductor layer of polycrystalline silicon;

forming a gate insulating layer on the semiconductor layer;
forming a gate electrode on the gate insulating layer over the semiconductor layer, the gate electrode being connected to the gate line;
doping the semiconductor layer with impurities using the gate electrode as a doping mask to define a first semiconductor region of intrinsic polycrystalline silicon and a second semiconductor region of impurity-doped polycrystalline silicon at both sides of the first semiconductor region;
forming the interlayer insulating layer on the gate electrode, the interlayer insulating layer having a semiconductor contact hole exposing the second semiconductor region; and
forming a source electrode and the drain electrode on the interlayer insulating layer, the source and drain electrodes contacting the second semiconductor region through the semiconductor contact hole.

* * * * *